United States Patent
Grede et al.

(10) Patent No.: US 10,263,314 B2
(45) Date of Patent: Apr. 16, 2019

(54) COUPLING HIGH-FREQUENCY SIGNALS WITH A POWER COMBINER

(71) Applicant: TRUMPF Huettinger GmbH + Co. KG, Freiburg (DE)

(72) Inventors: Andre Grede, Freiburg (DE); Alexander Alt, Freiburg (DE); Daniel Gruner, Muellheim (DE); Anton Labanc, Ehrenkirchen (DE)

(73) Assignee: TRUMPF Huettinger GmbH + Co. KG, Freiburg (DE)

( * ) Notice: Subject to any disclaimer, the term of this patent is extended or adjusted under 35 U.S.C. 154(b) by 0 days.

(21) Appl. No.: 15/856,264

(22) Filed: Dec. 28, 2017

(65) Prior Publication Data

US 2018/0123213 A1 May 3, 2018

Related U.S. Application Data

(63) Continuation of application No. PCT/EP2016/065377, filed on Jun. 30, 2016.

(30) Foreign Application Priority Data

Jun. 30, 2015 (DE) .......................... 10 2015 212 232

(51) Int. Cl.
*H03H 7/38* (2006.01)
*H05K 1/18* (2006.01)
(Continued)

(52) U.S. Cl.
CPC ................. *H01P 5/16* (2013.01); *H03H 7/48* (2013.01); *H03H 2001/0085* (2013.01)

(58) Field of Classification Search
CPC ..... H01P 5/16; H01P 5/12; H03H 7/38; H03F 1/02
(Continued)

(56) References Cited

U.S. PATENT DOCUMENTS 4,839,712 A * 6/1989 Mamodaly .............. H01L 23/66
257/531
5,770,478 A * 6/1998 Iruvanti .............. H01L 21/4878
257/E23.103
(Continued)

FOREIGN PATENT DOCUMENTS

DE 2733888 2/1979
DE 10211609 10/2003
(Continued)

OTHER PUBLICATIONS

Demneh et al., "A lumped-element power divider/combiner suitable for high power applications," Microwave and Millimeter Wave Technology (ICMMT), 2012 IEEE, May 5, 2012, 4 pages.
(Continued)

*Primary Examiner* — Brandon S Cole
(74) *Attorney, Agent, or Firm* — Fish & Richardson P.C.

(57) ABSTRACT

A power combiner in the form of a balanced LC combiner is provided. Inputs of the power combiner are isolated from one another via at least one RC matching element. The at least one RC matching element is dimensioned such that the connection between the inputs is at a stable potential during operation of the power combiner at at least one position. The power combiner can be formed in a planar design and have electrically conductive layers running parallel to one another. At least an inductor and a combiner capacitor are formed in the electrically conductive layers. A power combiner arrangement including the power combiner and high-frequency signal sources attached at least two inputs is also provided. The high-frequency signal sources can be in the form of frequency-agile transistor amplifiers.

18 Claims, 3 Drawing Sheets

(51) Int. Cl.
*H01P 5/16* (2006.01)
*H03H 7/48* (2006.01)
*H03H 1/00* (2006.01)

(58) Field of Classification Search
USPC .................................................. 327/560–602
See application file for complete search history.

(56) References Cited

U.S. PATENT DOCUMENTS

| | | | | |
|---|---|---|---|---|
| 6,472,950 | B1* | 10/2002 | London | H01P 5/12 |
| | | | | 333/125 |
| 6,967,544 | B2 | 11/2005 | Ji | |
| 7,046,088 | B2* | 5/2006 | Ziegler | H03F 1/56 |
| | | | | 330/207 A |
| 8,130,057 | B2* | 3/2012 | Jones | H03H 7/48 |
| | | | | 333/126 |
| 8,373,520 | B2* | 2/2013 | Darges | H03H 7/48 |
| | | | | 333/124 |
| 9,209,744 | B1* | 12/2015 | Struble | H03B 5/1218 |
| 9,705,468 | B2* | 7/2017 | Lee | H03H 7/461 |
| 9,712,131 | B2* | 7/2017 | Thorup | H03H 7/0123 |
| 2005/0088231 | A1* | 4/2005 | Ziegler | H03F 1/56 |
| | | | | 330/251 |
| 2005/0099231 | A1* | 5/2005 | Sutardja | H03F 3/217 |
| | | | | 330/251 |
| 2012/0292441 | A1 | 11/2012 | Drela et al. | |
| 2016/0087586 | A1* | 3/2016 | Szymanowski | H01L 25/0652 |
| | | | | 330/250 |
| 2017/0034913 | A1* | 2/2017 | Mu | H05K 1/111 |

FOREIGN PATENT DOCUMENTS

| | | |
|---|---|---|
| DE | 60305553 | 5/2007 |
| DE | 10 2012 200634 | 7/2013 |
| EP | 0210606 | 2/1987 |
| EP | 0911904 | 4/1999 |
| EP | 1347532 | 9/2003 |
| WO | WO 2017/001595 | 1/2017 |

OTHER PUBLICATIONS

Ercoli et al., "An extremely miniaturized ultra wide band 10 67 GHz Power Splitter in 65nm CMOS Technology", Microwave Symposium Digest (MTT), 2012 IEEE, Jun. 17, 2012, 4 pages.

International Search Report and Written Opinion in International Application No. PCT/EP2016/065377, dated Oct. 7, 2016, 27 pages (with English translation).

Kim et al., "Miniature Four-Way and Two-Way 24 GHz Wilkinson Power Dividers in 0.13m CMOS," IEEE Microwave and Wireless Components Letters, Sep. 2007, 17: 658-660.

* cited by examiner

COUPLING HIGH-FREQUENCY SIGNALS WITH A POWER COMBINER

CROSS REFERENCE TO RELATED APPLICATIONS

This application is a continuation of and claims priority under 35 U.S.C. § 120 from PCT Application No. PCT/EP2016/065377 filed on Jun. 30, 2016, which claims priority from German Application No. DE 10 2015 212 232.8, filed on Jun. 30, 2015. The entire contents of each of these priority applications are incorporated herein by reference.

TECHNICAL FIELD

The invention relates to devices and systems for coupling high-frequency signals with a power combiner, particularly for coupling high-frequency signals having a frequency of more than 1 MHz to an output power of more than 100 W.

BACKGROUND

Power combiners are known from the following documents, for example: EP 0 210 606 A2, DE 27 33 888 A1, US 2014/0292441 A1, EP 1 347 532 A1.

The output power of high-frequency (HF) signal sources, in particular of HF transistor amplifiers, is limited to from several 100 W to a few kW. In order to achieve a higher output power, a plurality of high-frequency signal sources therefore have to be interconnected by a power combiner. The power combiners are intended to have losses that are as small as possible for a large bandwidth.

At the same time, however, the inputs of the power combiner, to which inputs the high-frequency signal sources can be connected, are intended to be insulated from one another as well as possible, in order to prevent transverse supply of the high-frequency signal sources and an uneven distribution of reflected output power. Unequal amplitudes, phases or internal impedances of the high-frequency signal sources connected to the power combiners result in particular in a push-pull signal that is detrimental to the high-frequency signal sources. Additionally or alternatively thereto, when the distribution of the reflected power is unequal, the phases and/or amplitudes and the load impedance of the individual amplifiers can vary. This can lead to excessive stress on the amplifier that is the most heavily loaded.

The high-frequency signal sources connected to the inputs of a power combiner can be protected when the frequencies of the high-frequency signal sources are constant. However, for matching to a load that can be connected to an output of the power combiner, the high-frequency signal sources connected to the inputs of the power combiner are operated at a variable frequency (known as a frequency tuning operation). It is therefore desirable to provide a power combiner of which the inputs are significantly better matched and insulated in the event of unequal amplitudes, phases or internal impedances of high-frequency signal sources connected to the inputs, even in the event of frequency changes.

SUMMARY

One of the objects of the present invention is to produce a power combiner and a power combiner arrangement including a power combiner of this kind which work in a safe and stable manner during the frequency tuning operation.

One aspect of the present invention features a power combiner for coupling high-frequency signals having a frequency of more than 1 MHz to an output power of more than 100 W, the power combiner including:
a) a first input for a first high-frequency signal;
b) a second input for a second high-frequency signal;
c) an output for connecting an energy-consuming device (e.g., a load);
d) a ground connection;
e) a first inductor which connects the first input to the output;
f) a second inductor which connects the second input to the output;
g) a combiner capacitor which connects the output to the ground connection;
where the first inductor is magnetically decoupled from the second inductor and the first input is connected to the second input via an RC matching element of the power combiner.

In some cases, the power combiner can be formed by a multilayer printed circuit board in an at least partially planar manner.

The power combiner can further include a first printed circuit board including a first electrically conductive layer and a first electrically insulating layer.

The first printed circuit board can further include an RC matching element (or an RC adapter).

The power combiner can include an LC combiner made of inductors and a shared combiner capacitor, and the inductors are magnetically decoupled from one another.

Decoupling the two inductors does not exclude only slight parasitic coupling. However, the aim is as little coupling as possible. For this purpose, the inductors can be arranged so as to be mutually spaced in parallel planes or in the same plane as planar inductors. The outermost windings of spaced planar inductors of this kind can have a spacing of at least 1 cm.

In some cases, a matching network is provided between the inputs of the power combiner, which network includes a resistive-capacitive circuit arrangement, e.g., the RC matching element. The RC matching element can be dimensioned on the basis of a fundamental frequency at which the power combiner is operated. As a result, the power combiner makes it possible to achieve small losses for small sizes and large bandwidths.

In some examples, the power combiner is designed (or configured) to couple high-frequency signals of between 1 MHz and 200 MHz.

In a particular example, the power combiner is designed to output powers of more than 2 kW.

In a particular example of the power combiner, the power combiner is designed to form a splitting and combining loss (attenuation) of less than 0.5 dB, less than 0.1 dB, or less than 0.05 dB. This is the case in particular when operating at a frequency of ±10% of the fundamental frequency.

The power combiner can be operated as a power splitter.

The power combiner can include a third input for a third high-frequency signal, the third input being connected to the output via a third inductor of the power combiner, the third inductor being magnetically decoupled from the first inductor and the second inductor, a first RC matching element being connected to the first input at one end, a second RC matching element being connected to the second input at one end and a third RC matching element being connected to the third input at one end, the first RC matching element, the second RC matching element and the third RC matching element being interconnected at the other end.

In this embodiment, three high-frequency signal sources can be connected at each input of the power combiner. The first input is connected to the second input via the first RC matching element and the second RC matching element. The second input is connected to the third input via the second RC matching element and the third RC matching element. The third input is connected to the first input via the third RC matching element and the first RC matching element.

The power combiner can further include an additional input for an additional high-frequency signal, the additional input being connected to the output via an additional inductor of the power combiner, the additional inductor being magnetically decoupled from the first inductor, the second inductor and the third inductor, and an additional RC matching element being connected to the additional input at one end and to the first RC matching element, the second RC matching element and the third RC matching element at the other end.

The power combiner can include any number of additional inputs, which are each connected to the output via an additional inductor, the additional inductors being magnetically decoupled from the remaining inductors, the additional inputs each being connected to an additional RC matching element, the additional RC matching elements each being connected to the additional input at one end and to the other RC matching elements at the other end.

The inductors can have the same size (e.g., equally dimensioned). The first RC matching element, the second RC matching element, the third RC matching element and/or each additional RC matching element can have the same size (e.g., equally dimensioned).

In some examples, the RC matching elements are selected such that the total impedance between each two inputs is 100 Ω. As a result, commercially available high-frequency signal sources having an output resistance of 50 Ω can be interconnected effectively and safely to the power combiner.

The RC matching elements can be interconnected in a crossing point at one end to simplify the circuit and facilitate the production of the power combiner. The crossing point can be star-shaped.

An RC matching element can include a series connection of a matching resistor and a matching capacitor. A series connection of this kind can have a simple design, can be easily calculated and dimensioned and can be produced cost-effectively.

The RC matching element can be in the form of a series connection of a matching resistor and a matching capacitor.

Each of a plurality of RC matching elements can include a series connection of a matching resistor and a matching capacitor or be formed by a series connection of a matching resistor and a matching capacitor.

In some cases, all the RC matching elements include a series connection of a matching resistor and a matching capacitor or can be each formed by a series connection of a matching resistor and a matching capacitor.

The production of the power combiner can be further simplified and the installation space required for the power combiner can be further reduced if the power combiner is formed by a multilayer printed circuit board in an at least partially planar manner. The power combiner can include a first printed circuit board. The first printed circuit board can include a first electrically conductive layer and a first electrically insulating layer. The first electrically conductive layer can be arranged on the first electrically insulating layer.

The multilayer printed circuit board can include a plurality of electrically conductive layers which are arranged in particular in parallel with one another.

A plurality of all the electrically conductive layers of the multilayer printed circuit board, can be not separated by air, but rather by an electrically insulating layer, e.g., a dielectric, from the particular adjacent electrically conductive layer, to save installation space and increase the dielectric strength of the power combiner.

The power combiner can be characterized in that the first printed circuit board includes an RC matching element. In this case, the first printed circuit board can be arranged on the power combiner such that it is accessible from the outside. As a result, the RC matching element can be easily adjusted.

The first printed circuit board can include a plurality of the RC matching elements, e.g., all the RC matching elements.

The RC matching elements can be connected to the first printed circuit board in the crossing point. The first printed circuit board can be formed axially symmetrically to an axis which extends perpendicularly to the main plane of the first printed circuit board and intersects the crossing point.

A matching resistor and a matching capacitor of an RC matching element can each be fitted to the first printed circuit board in component form. The RC matching element can thus be subsequently modified, for example replaced or differently dimensioned.

All matching resistors and all matching capacitors of the RC matching element can be each fitted to the first printed circuit board in component form.

The first printed circuit board can include the first input and the second input, or all inputs. If the first printed circuit board is accessible from the outside, the high-frequency signal sources can be easily connected to the power combiner as a result. The first printed circuit board can include the output and/or the ground connection.

Installation space can be saved and the production of the power combiner can be simplified if the combiner capacitor is in the form of a plate capacitor, a first plate of the plate capacitor being formed on a second electrically conductive layer of the multilayer printed circuit board and a second plate of the plate capacitor being formed on a third electrically conductive layer of the multilayer printed circuit board.

The plate capacitor can include a third plate which is conductively connected to the first plate and be formed on a fourth electrically conductive layer of the multilayer printed circuit board. The capacitance of the combiner capacitor can thereby be significantly increased without substantial increase in installation space.

The second plate of the plate capacitor can be arranged between the first plate and the third plate.

The second plate can be connected to the ground connection.

In some embodiments, the ground connection is connected to a cooling plate of the power combiner.

To save more installation space, the second electrically conductive layer can include the first inductor in the form of a planar inductor.

In addition, the second electrically conductive layer can include the second inductor in the form of a planar inductor, the third inductor in the form of a planar inductor and/or the fourth inductor in the form of a planar inductor. The second electrically conductive layer can include all the inductors, the inductors each being in the form of a planar inductor.

Another aspect of the present invention features a power combiner arrangement including a power combiner as described above, the power combiner arrangement including a first high-frequency signal source which is connected to the first input and a second high-frequency signal source which is connected to the second input, and including an energy-consuming device which is connected to the output.

The power combiner arrangement can include a third high-frequency signal source which is connected to the third input and/or a fourth high-frequency signal source which is connected to the fourth input. The power combiner arrangement can also include further high-frequency signal sources which are connected to additional inputs.

The first high-frequency signal source, the second high-frequency signal source, the third high-frequency signal source, the fourth high-frequency signal source and/or additional high-frequency signal sources can be in the form of HF transistor amplifiers, e.g., frequency agile HF transistor amplifiers. All the high-frequency signal sources can be identical.

The energy-consuming device (e.g., a load) can include a plasma system.

The impedance of the RC matching element can be selected such that the total impedance between two inputs of the power combiner corresponds to the sum of the output impedances of the high-frequency signal sources which are connected to the two inputs. The high-frequency signal sources can be thereby insulated from one another and are protected particularly effectively from a push-pull signal.

The high-frequency signal sources can each include an output impedance of 50 Ω, the RC matching elements being selected such that the total impedance between two inputs, to which the high-frequency signal sources are connected, is 100 Ω. As a result, the power combiner arrangement makes it possible to use commercially available high-frequency signal sources.

Additional features and advantages of the invention can be found in the following detailed description of a plurality of embodiments of the invention, by way of the drawings which show details essential to the invention, and in the claims.

The features shown in the drawings are shown so as to be able to make the particularities according to the invention clearly visible. The various features may each be implemented in isolation or together in any desired combination in variants of the invention.

DETAILED DESCRIPTION

Figure 1:
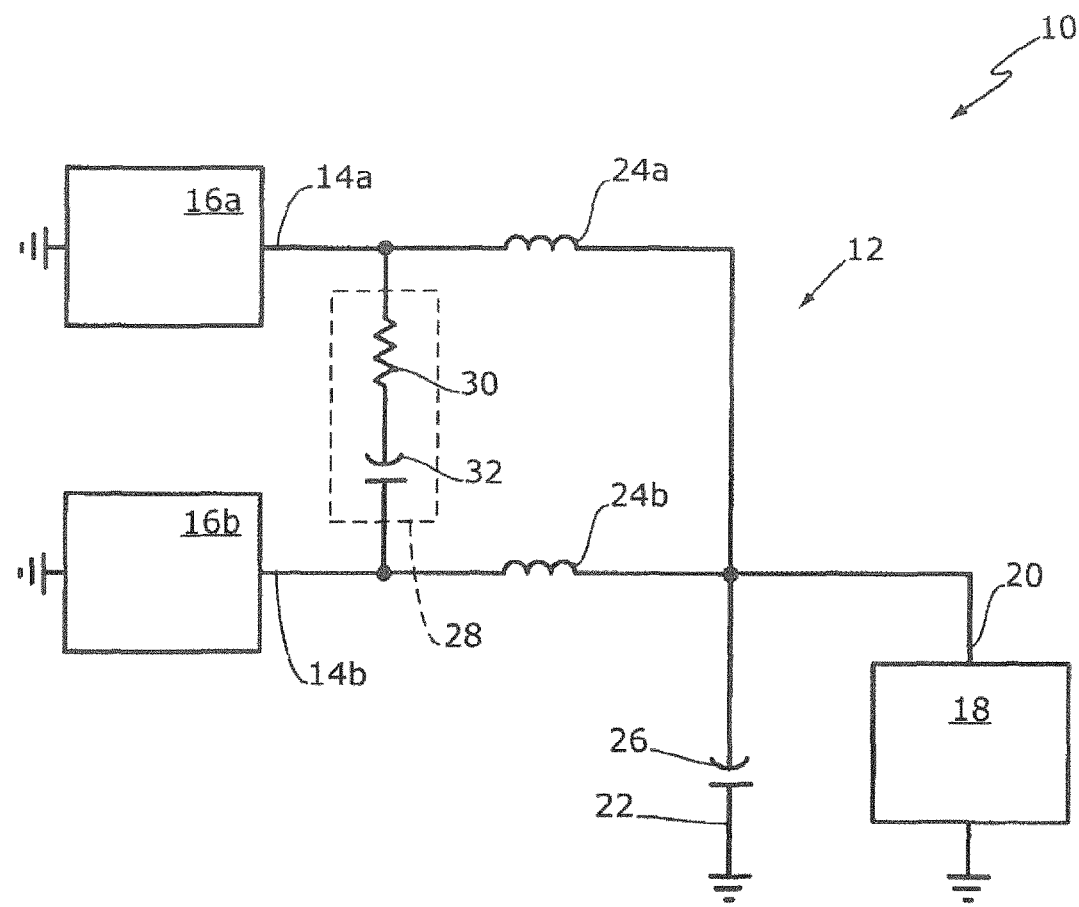
FIG. 1 is a wiring diagram of a first power combiner arrangement according to the invention including a power combiner and two high-frequency signal sources connected to the power combiner.

FIG. 1 shows a power combiner arrangement 10 including a power combiner 12. The power combiner 12 includes a first input 14a and a second input 14b, to each of which a high-frequency signal source 16a, 16b is connected. The high-frequency signal sources 16a-b are used to supply an energy-consuming device 18, e.g., in the form of a plasma system. The energy-consuming device 18 is connected to an output 20 of the power combiner 12. The power combiner further includes a ground connection 22.

The high-frequency signals from the high-frequency signal sources 16a-b can be coupled by inductors 24a, 24b and a combiner capacitor 26.

To insulate the two inputs 14a-b and to protect the two high-frequency signal sources 16a-b from unevenly distributed reflected push-pull signals, an RC matching element 28 (framed by a dashed line in FIG. 1) is connected between the inputs 14a-b. The RC matching element 28 includes a matching resistor 30 and a matching capacitor 32.

The RC matching element 28 is in the form of a series connection of the matching resistor 30 and the matching capacitor 32. The RC matching element 28 is dimensioned such that the impedance between the inputs 14a-b corresponds to the sum of the output impedances of the high-frequency signal sources 16a-b. In the present case, the two high-frequency signal sources 16a-b each have an output impedance of 50Ω. The RC matching element 28 is thus dimensioned such that the impedance between the inputs 14a-b corresponds to 100 Ω.

In this case, the impedance between the inputs 14a-b is determined by the RC matching element 28 and the two inductors 24a-b and is calculated, based on a fundamental frequency f, as follows:

$$Z = \left( \frac{1}{j\omega L_1 + j\omega L_2} + \frac{1}{R_1 - \frac{j}{\omega C}} \right)^{-1} = 100 \ \Omega$$

In this case, w is equal to 2πf, Z is the impedance between the inputs 14a-b, $L_1$ is the inductance of the first inductor 24a, $L_2$ is the inductance of the second inductor 24b, $R_1$ is the resistance of the matching resistor 30 and C is the capacitance of the matching capacitor 32.

As a result, the matching resistor 30 has a resistance of 50 Ω, the matching capacitor 32 has a capacitance of 78 pF, the inductors 24a-b each have an inductance of 195 nH and the combiner capacitor has a capacitance of 78 pF. The above-mentioned calculation provides an optimal balance of the power combiner 12 in the event of deviations from the fundamental frequency of the high-frequency signal sources 16a-b.

Figure 2:
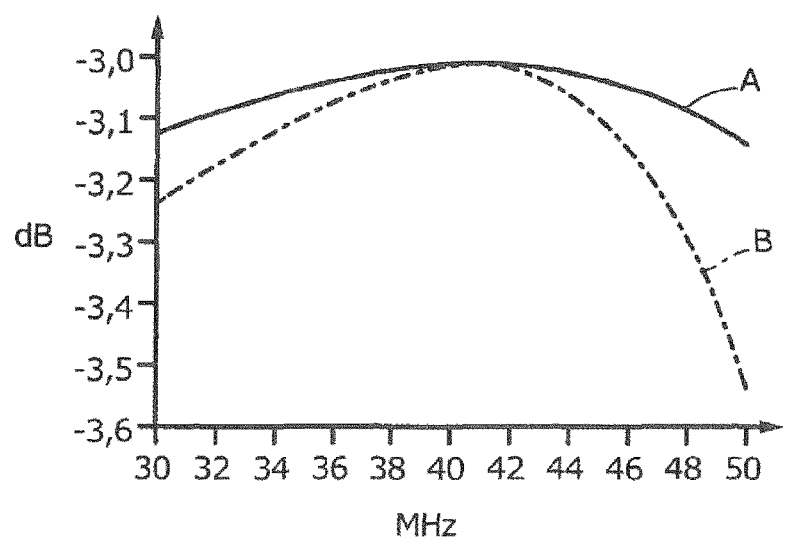
FIG. 2 is a diagram for comparing the power combiner arrangement according to the invention with a Wilkinson circuit according to the prior art.

FIG. 2 shows a comparison of the bandwidths of a balanced power combiner according to the invention (solid line A) with a CLC Wilkinson power combiner according to the prior art (dot-dash line B). It can be seen in FIG. 2 that the power combiner according to the invention has a significantly better transfer characteristic in the case of deviation from a fundamental frequency, on the basis of which the power combiner is dimensioned.

Figure 3:
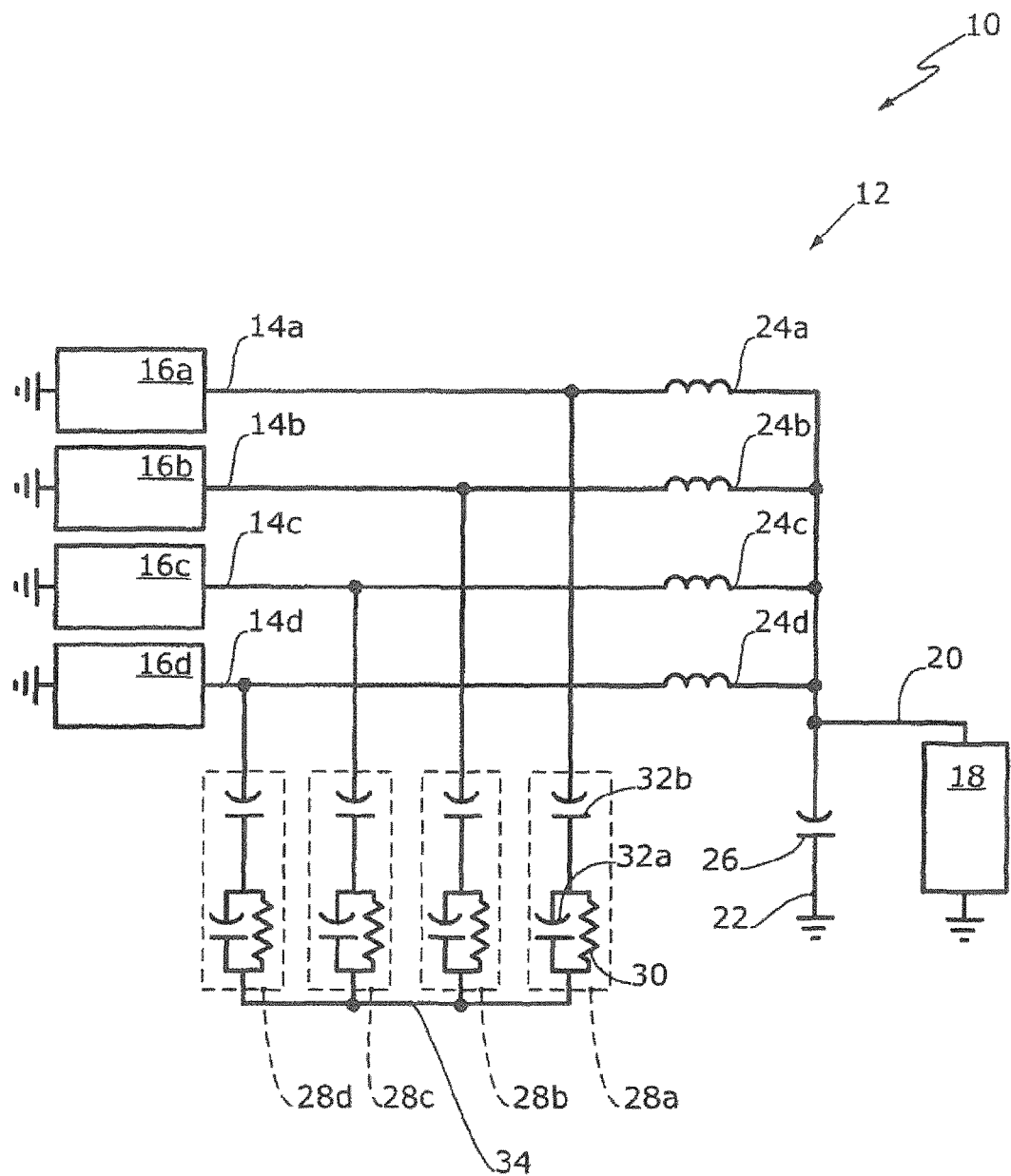
FIG. 3 is a wiring diagram of a second power combiner arrangement according to the invention including an additional power combiner and four high-frequency signal sources connected to the power combiner FIG. 4. is a schematic partial view of a structure of an additional power combiner.

FIG. 3 shows an additional power combiner arrangement 10 including a power combiner 12. The power combiner 12 includes a first input 14a, a second input 14b, a third input 14c and a fourth input 14d. A first high-frequency signal source 16a is connected to the first input 14a, a second high-frequency signal source 16b is connected to the second input 14b, a third high-frequency signal source 16c is connected to the third input 14c and a fourth high-frequency signal source 16d is connected to the fourth input 14d.

A first inductor 24a is connected to the first input 14a at one end, a second inductor 24b is connected to the second input 14b at one end, a third inductor 24c is connected to the third input 14c at one end and a fourth inductor 24d is connected to the fourth input 14d at one end. The inductors 24a-d are connected to an output 20 at the other end, to which output an energy-consuming device 18 is connected. Furthermore, the inductors 24a-d are connected to a combiner capacitor 26 at the other end. The combiner capacitor 26 is connected to a ground connection 22.

A first RC matching element 28a is connected to the first input 14a at one end, a second RC matching element 28b is connected to the second input 14b at one end, a third RC matching element 28c is connected to the third input 14c at one end and a fourth RC matching element 28d is connected to the fourth input 14d at one end. The RC matching elements 28a-d are interconnected at a crossing point 34 at the other end.

The RC matching elements 28a-d are identical. Therefore, to avoid repetitions, only the first RC matching element 28a is described in more detail in the following. The first RC matching element 28a includes a parallel connection of a matching resistor 30 and a first matching capacitor 32a, the parallel connection being connected in series with a second matching capacitor 32b. The first RC matching element 28a is dimensioned such that there is an impedance between the inputs 14a-b (taking into consideration the second RC matching element 28b and the inductors 24a-b) that corresponds to the sum of the output impedances of the high-frequency signal sources 16a-b. As a result, the crossing point 34 has virtual ground potential. In the present case, the first RC matching element 28a has a resistance of 50 Ω, the inductors 24a-b each having an inductance of from 300 nH to 400 nH, e.g., 339 nH.

Figure 4:
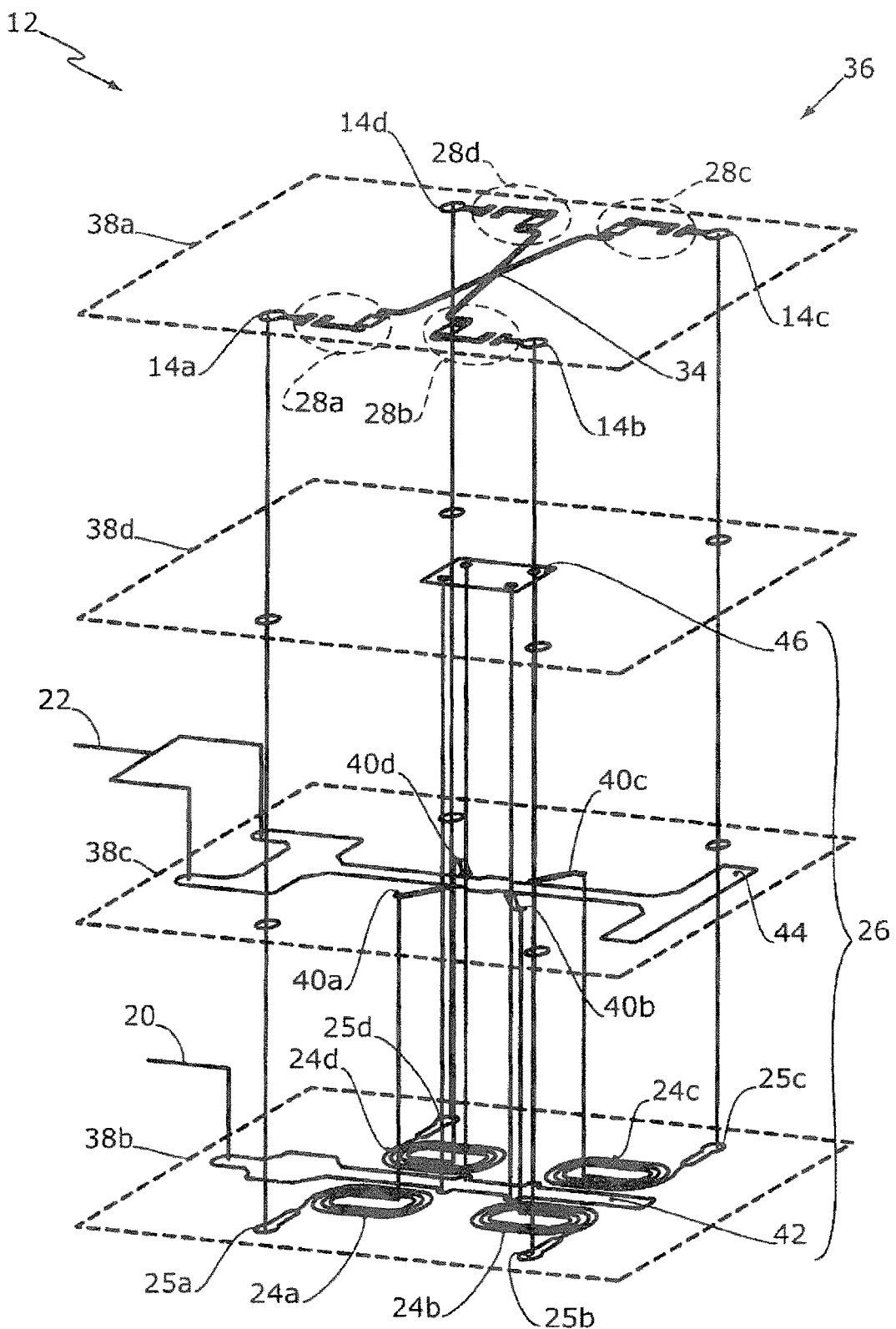

FIG. 4 shows a schematic structure of an additional power combiner 12. The power combiner 12 includes a multilayer printed circuit board 36. The multilayer printed circuit board 36 includes a plurality of electrically conductive layers. In the present case, the multilayer printed circuit board 36 has a first electrically conductive layer 38a, a second electrically conductive layer 38b, a third electrically conductive layer 38c and a fourth electrically conductive layer 38d.

The electrically conductive layers 38a-d are shown disproportionately far apart from one another for reasons of clarity.

In FIG. 4, also for reasons of clarity, it is not the electrically conductive structures of the electrically conductive layers 38a-d that are provided with a reference sign, but rather planes (indicated by dash lines in FIG. 4) in which the electrically conductive structures of the electrically conductive layers 38a-d are located. Between the electrically conductive layers 38a-d, the multilayer printed circuit board 36 includes electrically insulating layers, which are not shown in FIG. 4 for reasons of clarity.

Inputs 14a-d are located in the uppermost first electrically conductive layer 38a, which is accessible from the outside. The inputs 14a-d are each connected to RC matching elements 28a-d, which are framed by a dashed line. The RC matching elements 28a-d each include housings for matching resistors and matching capacitors, which housings are merely implied in FIG. 4 for reasons of representability.

The ends of the RC matching elements 28a-d remote from the inputs 14a-d are brought together at a crossing point 34. The punctiform pattern of the junction at the crossing point 34 indicates that the crossing point 34 advantageously has a good symmetry. The capacitive effect can be further reduced by the structure having a small surface area.

The inputs 14a-d are each connected to an inductor 24a-d. The ends of the inductors 24a-d are connected to a first plate 42 via bridges 40a-d. An output 20 is connected to the first plate 42.

The multilayer printed circuit board 36 includes, in the third electrically conductive layer 38c, a second plate 44 which is opposite the first plate 42. The second plate 44 is connected to a ground connection 22. The second plate 44 is not in contact with the bridges 40a-d.

The multilayer printed circuit board 36 optionally includes, in the fourth electrically conductive layer 38d, a third plate 46 which can be, just the same as the first plate 42, connected to the bridges 40a-d. The third plate 46 thus has the same potential as the first plate 42. The first plate 42, the second plate 44 and the third plate 46 together form a combiner capacitor 26. The capacitance of the combiner capacitor 26 is significantly increased by the third plate 46.

The feedthroughs between the layers of the multilayer printed circuit board 36 can pass through all the layers and include electrically conductive pads in each layer. In this way, four pads are present on the first layer 38a, which pads have electrical contact from the second plane (where the second electrically conductive layer 38b is located) from the potential of the output 20 to the first layer 38a. The pads are located very close to the crossing point 34. To safely insulate and to prevent leakage currents, an insulating plate can be pressed on or adhesively bonded to the first plane (where the first electrically conductive layer 38a is located). The insulating plate can have the same size of the third plate 46.

The matching elements 28, 28a-28d can each include a series connection of a capacitor and resistor. The resistor can be cooled well if it is arranged in a recess in the multilayer printed circuit board 36 such that the contacts are soldered to the multilayer printed circuit board 36 and the warming body thereof is bonded to a cooling plate arranged beneath the multilayer printed circuit board 36.

The multilayer printed circuit board 36 can be cooled if it is fastened by a ceramic plate, which is fastened to a cooling plate. The ceramic plate is fastened between the multilayer printed circuit board 36 and the cooling plate. The ceramic plate can be from 2 mm to 7 mm thick. The ceramic plate can have smaller surface area dimensions than the multilayer printed circuit board 36. The multilayer printed circuit board 36 can thus project beyond the ceramic plate.

The ceramic plate can be designed such that it covers the inductors 24a-24d but does not cover terminals 25a-d. In this way, the terminals 25a-d can be directly connected to other printed circuit boards, for example to the outputs of the amplifier printed circuit boards.

The ceramic plates can be designed such that they cover the inductors 24a-d but do not cover the terminals of the output 20 or the ground connection 22. The terminals can then be directly connected to other printed circuit boards or to the cooling plate connected to the ground.

Considering all the drawings together, the invention relates to a power combiner 12 in the form of a balanced LC combiner. Inputs 14a-d of the power combiner 12 are each insulated from one another by at least one RC matching element 28, 28a-d. The at least one RC matching element 28, 28a-d can be dimensioned such that the connection between the inputs 14a-d has a stable potential at at least one point during operation of the power combiner 12. The power combiner 12 can have a planar design and include electrically conductive layers 38a-d which extend in parallel with one another. At least inductors 24a-d and a combiner capacitor 26 can be formed in the electrically conductive layers 38a-d. Implementations of the invention further provide a power combiner arrangement 10 including a power combiner 12 as described above and high-frequency signal sources 16a-d connected to at least two inputs 14a-d, which sources can be in the form of frequency agile transistor amplifiers.

What is claimed is:

1. A power combiner for coupling high-frequency signals having a frequency of more than 1 MHz to an output power of more than 100 W, wherein the power combiner comprises:
a first input for a first high-frequency signal;
a second input for a second high-frequency signal;
an output for connecting an energy-consuming device;
a ground connection;
a first inductor connecting the first input to the output;
a second inductor connecting the second input to the output and being magnetically decoupled from the first inductor;
a combiner capacitor connecting the output to the ground connection; and
a multilayer printed circuit board that is at least partially planar and comprises a first printed circuit board including a first electrically conductive layer and a first electrically insulating layer, wherein the first printed circuit board comprises an RC matching element via which the first input is connected to the second input.

2. The power combiner of claim 1, further comprising:
a third input for a third high-frequency signal;
a third inductor connecting the third input to the output and being magnetically decoupled from the first inductor and the second inductor;
a first RC matching element being connected to the first input at one end of the first RC matching element;
a second RC matching element being connected to the second input at one end of the second RC matching element; and
a third RC matching element being connected to the third input at one end of the third RC matching element,
wherein the first RC matching element, the second RC matching element and the third RC matching element are interconnected at the other ends of the first RC matching element, the second RC matching element and the third RC matching element.

3. The power combiner of claim 2, further comprising:
an additional input for an additional high-frequency signal;
an additional inductor connecting the additional input to the output and being magnetically decoupled from the first inductor, the second inductor and the third inductor; and
an additional RC matching element being connected to the additional input at one end of the additional RC matching element and to the first RC matching element, the second RC matching element and the third RC matching element at the other end of the additional RC matching element.

4. The power combiner of claim 1, wherein the RC matching element comprises a series connection of a matching resistor and a matching capacitor.

5. The power combiner of claim 4, wherein the matching resistor and the matching capacitor of the RC matching element are each fitted to the first printed circuit board.

6. The power combiner of claim 1, further comprising a plurality of RC matching elements each including a series connection of a matching resistor and a matching capacitor.

7. The power combiner of claim 1, wherein the first input and the second input are on the first printed circuit board.

8. The power combiner of claim 1, wherein the combiner capacitor comprises a plate capacitor including:
a first plate formed on a second electrically conductive layer of the multilayer printed circuit board, and
a second plate formed on a third electrically conductive layer of the multilayer printed circuit board.

9. The power combiner of claim 8, wherein the plate capacitor comprises a third plate which is connected to the first plate and is formed on a fourth electrically conductive layer of the multilayer printed circuit board.

10. The power combiner of claim 9, wherein the second plate is arranged between the first plate and the third plate.

11. The power combiner of claim 8, wherein the second electrically conductive layer comprises the first inductor, and wherein the first inductor comprises a planar inductor.

12. The power combiner of claim 8, wherein the first electrically insulating layer is arranged between the first electrically conductive layer and the second electrically conductive layer.

13. The power combiner of claim 1, configured to couple the high-frequency signals with a frequency between 1 MHz and 200 MHz.

14. The power combiner of claim 1, configured to couple the high-frequency signals to the output power of more than 2 kW.

15. A power combiner arrangement comprising:
a first high-frequency signal source;
a second high-frequency signal source; and
a power combiner including:
a first input for receiving a first high-frequency signal from the first high-frequency signal source;
a second input for receiving a second high-frequency signal from the second high-frequency signal source;
an output for connecting an energy-consuming device;
a ground connection;
a first inductor connecting the first input to the output;
a second inductor connecting the second input to the output and being magnetically decoupled from the first inductor;
a combiner capacitor connecting the output to the ground connection; and
a multilayer printed circuit board that is at least partially planar, the multilayer printed circuit board comprising a first printed circuit board including:
a first electrically conductive layer,
a first electrically insulating layer, and
at least one RC matching element via which the first input is connected to the second input.

16. The power combiner arrangement of claim 15, wherein an impedance of the RC matching element is selected such that a total impedance between the first input and the second input corresponds to a sum of output impedances of the first and second high-frequency signal sources connected to the first and second inputs.

17. The power combiner arrangement of claim 15, wherein the first high-frequency signal source comprises a frequency-agile transistor amplifier.

18. The power combiner arrangement of claim 15, further comprising:
a cooling plate fastened to the multilayer printed circuit board and connected to the ground connection; and
a ceramic plate arranged between the multilayer printed circuit board and the cooling plate and configured to cover the inductors without covering terminals of the output and the ground connection.

* * * * *